(12) United States Patent
Olarescu et al.

(10) Patent No.: US 8,502,552 B2
(45) Date of Patent: Aug. 6, 2013

(54) METHOD FOR FAULT DETECTION IN CONTROLLING A ROTARY FIELD MOTOR

(75) Inventors: Nicola-Valeriu Olarescu, Wangen (DE); Martin Weinmann, Bad Waldsee (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 352 days.

(21) Appl. No.: 12/854,295

(22) Filed: Aug. 11, 2010

(65) Prior Publication Data
US 2011/0037495 A1 Feb. 17, 2011

(30) Foreign Application Priority Data

Aug. 11, 2009 (DE) .......................... 10 2009 036 919
Aug. 5, 2010 (DE) .......................... 10 2010 033 459

(51) Int. Cl.
*G01R 31/02* (2006.01)
*G01R 11/30* (2006.01)

(52) U.S. Cl.
USPC ...................................... 324/762.01; 324/143

(58) Field of Classification Search
None
See application file for complete search history.

(56) References Cited

U.S. PATENT DOCUMENTS

| | | | | |
|---|---|---|---|---|
| 4,953,054 A | * | 8/1990 | Fetzer et al. ..................... | 361/45 |
| 5,278,484 A | * | 1/1994 | Hakala ........................... | 318/760 |
| 6,160,414 A | * | 12/2000 | Matsubara et al. ........... | 324/537 |
| 6,969,969 B2 | * | 11/2005 | Weinmann ..................... | 318/811 |
| 7,227,325 B1 | * | 6/2007 | Talja et al. ..................... | 318/434 |
| 7,355,436 B2 | | 4/2008 | Zehentner et al. | |
| 8,179,060 B2 | * | 5/2012 | Wende et al. ....................... | 318/3 |
| 8,248,017 B2 | * | 8/2012 | Weinmann et al. ........... | 318/490 |
| 2003/0155875 A1 | * | 8/2003 | Weinmann ..................... | 318/110 |
| 2009/0284206 A1 | * | 11/2009 | Wende et al. .................. | 318/490 |
| 2010/0117583 A1 | * | 5/2010 | Weinmann et al. ........... | 318/490 |
| 2011/0270545 A1 | * | 11/2011 | Doktar et al. .................. | 324/509 |

FOREIGN PATENT DOCUMENTS

| | | |
|---|---|---|
| DE | 10236377 A1 | 2/2004 |
| EP | 0848492 A1 | 6/1998 |

* cited by examiner

*Primary Examiner* — Jermele M Hollington
(74) *Attorney, Agent, or Firm* — Laurence A. Greenberg; Werner H. Stemer; Ralph E. Locher

(57) ABSTRACT

The invention specifies a method for fault identification when driving a polyphase motor by means of a frequency converter, wherein, in a rest state, the frequency converter controls the phase voltages of the polyphase motor and the phase currents of the polyphase motor are measured. In this case, provision is made for, then in the rest state, the phase currents or current variables derived therefrom to be adjusted by closed-loop control to a predetermined setpoint current variable, for the frequency converter to be controlled so as to output an interference voltage variable for the phase voltages, for the response of the adjustment by closed-loop control to the interference voltage variable to be observed, and for a conclusion to be drawn regarding a fault of the frequency converter and/or the phases of the polyphase motor from the response of the closed-loop control. The cited method allows for largely loss-free detection of faults in the drive system of a polyphase motor. In the event of field-oriented closed-loop control, no additional complexity is required in the measuring device.

20 Claims, 7 Drawing Sheets

METHOD FOR FAULT DETECTION IN CONTROLLING A ROTARY FIELD MOTOR

BACKGROUND OF THE INVENTION

Field of the Invention

The invention relates to a method for fault identification when driving a polyphase motor by means of a frequency converter, wherein, in a rest state, the frequency converter controls the phase voltages of the polyphase motor and the phase currents of the polyphase motor are measured.

Such a method is suitable for fault identification in a converter-fed drive for a device operated by a polyphase motor. In particular, the method is suitable for fault identification when driving a polyphase motor in a domestic appliance, such as in a washing machine, in a centrifuge or in a food processor, or else in a machine tool. A polyphase motor is in this case understood to mean, for example, a permanent magnet electrical synchronous motor, an electrical reluctance motor or an electrical asynchronous motor.

In the case of a polyphase motor, variable phase voltages are applied to the motor phases by means of a frequency converter, with the result that a rotating magnetic field is induced via the corresponding motor windings in the motor. Depending on the motor embodiment, the rotor rotates synchronously or asynchronously in this magnetic rotating field.

If there is an interruption or a short circuit in the frequency converter, in the motor phases or in the motor windings, this can result in thermal overloading of a motor winding during operation of the motor, as a result of which there may be the risk of the motor catching light. Timely identification of such faults in the drive system of a polyphase motor is therefore extremely desirable.

A method for fault identification of the type mentioned at the outset is known, for example, from EP 0 848 492 A1. In said document, the polyphase motor is operated in a drive-less state with certain voltage patterns. In order to diagnose motor abnormalities and therefore faults in the drive system, the current responses are assessed. If the current response has an abnormal peak or waveform, it is concluded that there is a short circuit in the motor phases or feed lines or in the motor windings.

DE 102 36 377 A1 proposes a method for fault identification in a drive device with a polyphase motor, wherein, for the purposes of fault identification, the phase currents are measured at a given time in the respective period whilst simultaneously varying the associated phase voltages.

BRIEF SUMMARY OF THE INVENTION

An object of the invention is to provide an improved method for fault identification when driving a polyphase motor.

This object is achieved according to the invention for a method of the type mentioned at the outset by virtue of the fact that, in the rest state of the polyphase motor, the phase currents or current variables derived therefrom are adjusted by closed-loop control to a predetermined setpoint current variable, that the frequency converter is controlled so as to output an interference voltage variable for the phase voltages, that the response of the adjustment by closed-loop control to the interference voltage variable is observed, and that, from the response of the adjustment by closed-loop control, a conclusion is drawn regarding a fault of the frequency converter and/or the phases of the polyphase motor.

In this case, the invention is based on the consideration that in the event of an adjustment by closed-loop control to the phase currents, interference voltages which are intentionally introduced result in a response of the closed-loop control since such interference voltages naturally result in certain additional phase currents. In the case of an intact drive system, the closed-loop control response will be a corresponding back-emf, by means of which the interference voltage which is fed forward is compensated for. If the closed-loop control is observed, for example, in a reference system of the motor phases, an interference voltage which is fed forward to a phase would, as closed-loop control response, result in a corresponding back-emf being output in this phase. The phase current flowing as a result of the interference voltage is compensated for by the back-emf output by the controller.

If there is an interruption or a short circuit in the frequency converter, in the phases or in the motor windings, however, the closed-loop control response will deviate from the value to be expected. The phase currents now resulting from the interference voltage variable therefore deviate correspondingly from the intact state.

The invention is not restricted to adjusting, by closed-loop control, the phase currents to a very specific setpoint current variable or to outputting a very specific interference voltage variable. Instead, the setpoint current variable or the interference voltage variable can in principle be selected as desired. The invention therefore provides the considerable advantage that it is possible to select very low setpoint currents or setpoint currents which are equal to zero without any restriction as regards the fault identification, for closed-loop control purposes, as a result of which undesirable rotor movements, noises and losses in the polyphase motor, and line losses in the frequency converter are avoided or minimized during the fault identification.

As regards the closed-loop control method for the polyphase motor, the invention is likewise not restricted. The closed-loop control can in principle concern the phase currents which are actually to be measured in the reference system of the motor phases as controlled variable. However, it is likewise possible for the closed-loop control to also involve so-called field-oriented closed-loop control, for which purpose electromagnetic state variables of the polyphase motor are determined by means of a mathematical model in a space vector diagram, and wherein the frequency converter is driven electronically corresponding to the space vector variables determined from real variables.

In the latter case, the setpoint current variable and the interference voltage variable are not predetermined in the form of explicit setpoint phase currents or interference phase currents, but are each taken into consideration as corresponding components of the respective space vector in the closed-loop control.

In the case of the closed-loop control of a polyphase motor by means of space vector variables which has often been used in the meantime, use is made of the fact that the electromagnetic state variables in a polyphase motor are sufficiently described in terms of their magnitude and in terms of their direction in one plane. In a suitable two-dimensional coordinate system, the electromagnetic state variables of a polyphase motor can therefore be represented in each case by a so-called space vector, which is described by its length (magnitude) and by its position (angle). Alternatively, the corresponding coordinates on the axes of the coordinate system can be used to describe said space vector. By virtue of a mathematical transformation of the state variables describing the polyphase motor onto a rotating coordinate system, said polyphase motor can be reduced in terms of closed-loop control technology to a DC motor.

In principle, during the closed-loop control of a polyphase motor by means of space vector variables, two different coordinate systems are used. The stator-fixed coordinate system whose axes are denoted by $\alpha$ and $\beta$ is fixedly connected to the stator of the polyphase motor and is at a standstill. The electromagnetic space vector variables rotate in this coordinate system around the origin at the frequency of the rotating field. The phase voltages are added, for example vectorially, to form a rotating voltage space vector. Corresponding to the voltage space vector, the resultant space vector of the stator flux linkage rotates in the $\alpha$, $\beta$ coordinate system.

The field-oriented coordinate system whose axes are denoted by d and q rotates with the space vector of the rotor flux. To this extent, this coordinate system is aligned with the magnetic field which passes through the rotor. It rotates at the frequency of the feed voltage or the frequency of the voltage space vector. In this coordinate system, the electromagnetic variables of the polyphase motor are equal in magnitude, i.e. their coordinates do not have a sinusoidal profile. The respective angle of rotation of the rotating d, q coordinate system is denoted by $\theta$.

In a preferred configuration of the invention, correspondingly, the polyphase motor is subjected to field-oriented closed-loop control by means of space vector variables, wherein the frequency converter is driven electronically by means of a voltage space vector and a current space vector formed from the phase currents is used as controlled variable, wherein the setpoint current variable is predetermined as a setpoint current space vector, wherein an interference voltage space vector is fed forward to the controller output as interference voltage variable, and wherein the voltage space vector output by the closed-loop control system is observed as the response.

In the event of a field-oriented closed-loop control of the polyphase motor by means of space vector variables, in this case closed-loop current control which has already been implemented can be used for fault identification. Since the phase currents have already been measured in any case for the existing closed-loop current control in the original drive system, no additional complexity is required in the measuring device in order to implement the fault identification. A further advantage of the field-oriented closed-loop control is generally the fact that fewer components are required for the closed-loop control, but all of the motor phases are sampled in the closed-loop control system.

For fault identification, in a rest state of the polyphase motor, the interference voltage space vector is fed forward to the controller output, with the result that the corresponding phase voltages are generated via the frequency converter driven thereby. This results in certain phase currents which are measured and, after a transformation, enter the controller as actual current space vector. The comparison between the actual current space vector and the predetermined setpoint current space vector results in a voltage space vector which is output by the closed-loop control system and via which the frequency converter is driven so as to output corresponding phase voltages for compensating for the phase currents caused.

Preferably, the phase currents are adjusted by closed-loop control to a value of less than $\frac{1}{10}$ of the rated currents of the polyhase motor by means of the setpoint current variables. In this case, the rated currents denote the currents flowing during normal operation of the polyphase motor and for which the drive system as such is in general designed. By virtue of such limitation, as has already been mentioned, losses in the frequency converter and in the motor are minimized. Undesirable motor movements and noises are avoided. Particularly preferably, the phase currents are adjusted by closed-loop control to a zero current by means of the setpoint current variable.

In a further preferred embodiment as regards the field-oriented closed-loop control by means of space vector variables, the interference voltage space vector is fed forward a plurality of times with different rotary angles, and the respective response of the closed-loop control is observed. In this way, the motor phases and the switching states of the frequency converter are sampled to a certain extent. This makes it possible to pinpoint the location of the fault source. If, for example, in the event of a specific selected angle, an unexpected closed-loop control response occurs, the fault can be assigned to that switching state of the frequency converter which is associated with this angle or to a motor phase supplied by this switching state. By observing the closed-loop control response at different angles, it is thus possible to assign an established fault specifically to a switching element of the frequency converter or a specific motor phase.

In a preferred alternative as regards the field-oriented closed-loop control by means of space vector variables, the interference voltage space vector is continuously fed forward with any desired frequency at least over a full revolution, and the respective response of the closed-loop control is observed. In this way, the motor phases and the switching states of the frequency converter are sampled to a certain extent. This makes it possible to pinpoint the location of the fault source. If, for example in the case of a specifically selected angle, an unexpected closed-loop control response occurs, the fault can be assigned to that switching state of the frequency converter which is assigned to this angle or to a motor phase supplied by this switching state. By observing the closed-loop control response at different angles, it is thus possible to assign an established fault specifically to a switching element of the frequency converter or a specific motor phase. By continuously feeding forward the interference voltage space vector, faults can be identified continuously. A further improvement of the fault identification is achieved, in particular in the case of a permanent magnet electric synchronous motor, by the continuous feedforwarding of the interference voltage space vector being combined with feedforwarding with different angles of rotation.

Further preferably, the interference voltage space vector is fed forward a plurality of times, shifted through in each case the same angular increment, over a full revolution. As a result, even more precise pinpointing of the location of the fault is possible since the entire switching space or phase space is systematically sampled.

In an advantageous configuration, the interference voltage space vector is fed forward for example six times, offset with in each case an angular increment of 60°, over a full revolution for a three-phase polyphase motor. The reasoning behind this configuration is the consideration of the switching states of a frequency converter provided for connecting three motor phases. In general, such a frequency converter has in each case three bridge branches, which are each connected between a high and a low potential. In each of these bridge branches, in each case two switching elements are used, between which the terminal of a respective motor phase is located. By switching the respective switching elements, the respective motor phase is switched either to the high potential or to the low potential. It can be seen here that in total six active switching states result for such a frequency converter. The voltage space vectors corresponding to these switching states are rotated in each case through 60° with respect to one another in the space vector model, as a result of which the entire space is covered. A voltage space vector which is positioned between the active switching states is produced by virtue of the fact that the two adjacent switching states are switched for different lengths of time. In other words, the desired voltage space vector is produced by pulse width modulation.

It becomes apparent that interference voltage space vectors which are produced offset through in each case 60° are used to sample all of the active switching states, and therefore all of the switching elements of the individual bridge branches of the frequency converter. It is therefore possible from a consideration of the entire closed-loop control response to pinpoint the location of the faulty switching element of the frequency converter. Secondly, in each case specific motor phases are also affected by the respective switching states. It therefore also becomes possible to draw a conclusion regarding an interruption or a short circuit of a specific motor phase.

As regards the fault identification, expediently, the variable of the components of the voltage space vector output by the controller or the variable of the converted phase voltages is observed as the response. In the case of an intact drive system, the variable of the components of the output voltage space vector will approximately correspond to the variable of the components of the interference voltage space vector. The same applies correspondingly to the converted phase voltages and interference phase voltages. If a corresponding switching element of the frequency converter or one of the motor phases or motor windings is faulty, the closed-loop control response will deviate from this. The discrepancy can easily be observed.

In a development of this, the ratio of the components of the output voltage space vector and of the interference voltage space vector or of the converted corresponding phase voltages is observed as the response. From a ratio value determined in this way it is directly possible to draw a conclusion regarding a fault and to pinpoint the location of said fault.

In both cases, a limit value can be predetermined for the respectively considered or formed variable. If this limit value is overshot, a corresponding warning signal is output, for example, or the drive system is brought out of operation. By virtue of the corresponding warning signal, it is possible, for example, for a request to be output to the user to instigate servicing.

If in this way, for example, an unexpected discrepancy between the interference voltage variable and the output voltage of the current controller is established, it can be concluded that there is an associated interruption in the frequency converter, or, in the event of the detection of an excess current, it can be concluded that there is an earth fault or a short-circuited switching element of the frequency converter. An excess current occurs before a corresponding unexpected discrepancy has been established.

In a further expedient configuration, the interference voltage space vector is fed forward a plurality of times with a different rotary angle, and from the assignment of the detected unexpected discrepancy to the rotary angle, it is concluded that there has been an interruption, or, from the assignment of the detected excess current, it is concluded that there is the specific short-circuited switching element or the specific motor phase with an earth fault.

If the abovedescribed method with feedforwarding of an interference voltage variable does not result in any discrepancies in the response of the closed-loop control which can be observed, in a further preferred configuration the phase currents are observed during runup of the polyphase motor. If during runup of the polyphase motor an excess current is established, it can be concluded that there is a terminal short circuit between the motor phases.

Exemplary embodiments of the invention will be explained in more detail with reference to a drawing, in which:

DESCRIPTION OF THE INVENTION

Figure 1:
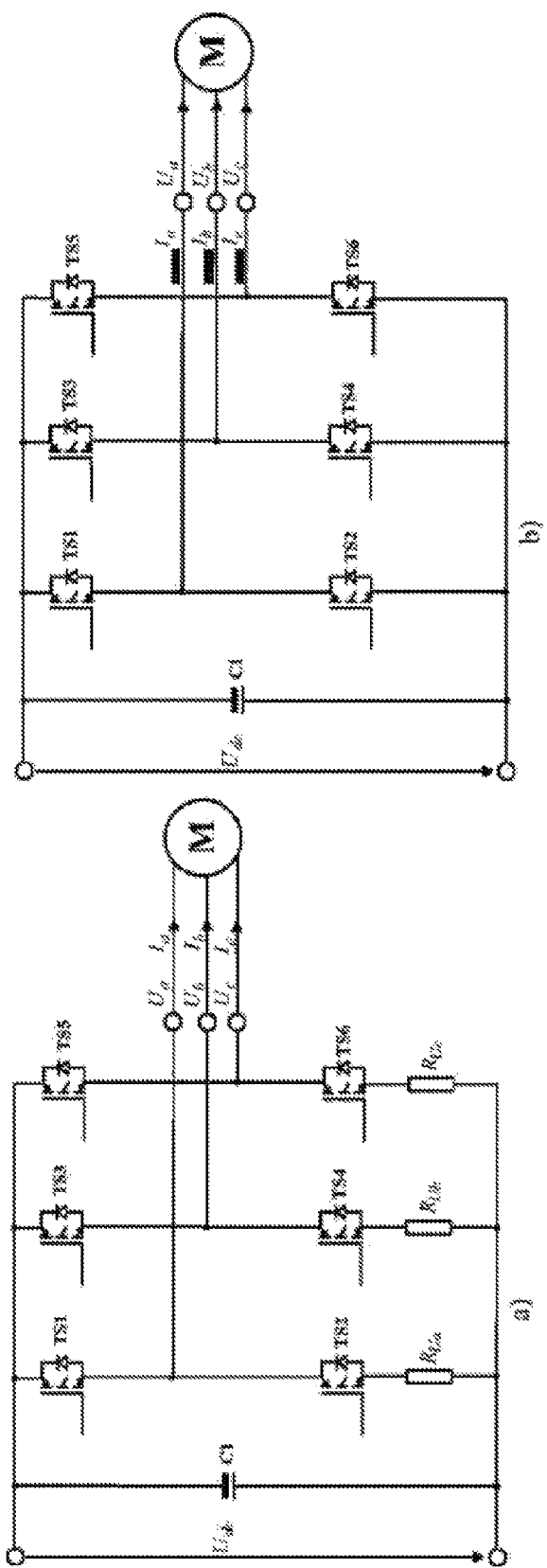
FIG. 1 shows, schematically, two variants for driving a polyphase motor with measurement of the phase currents.

FIGS. 1$a$) and 1$b$) show two variants for the closed-loop control of a polyphase motor M by means of a frequency converter, which, when driven correspondingly, outputs the respectively required phase voltages $U_a$, $U_b$ and $U_c$. In both variants, the adjustment by closed-loop control is in each case to the phase currents $I_a$, $I_b$ and $I_c$. For this purpose, the phase currents $I_a$ $I_b$ and $I_c$ across the resistors $R_{Ua}$, $R_{Ub}$ and $R_{Uc}$ in the associated bridge branches of the frequency converter are measured, as shown in FIG. 1$a$). As shown in FIG. 1$b$), the measurement of the phase currents $I_a$, $I_b$ and $I_d$ takes place directly at the motor phases.

The frequency converter illustrated in FIGS. 1$a$) and 1$b$) in each case comprises three bridge branches, which are connected between a high potential and a low potential of a DC voltage intermediate circuit. In the DC voltage intermediate circuit, a corresponding buffer capacitor C1 is provided. The DC voltage $U_{dc}$ is illustrated. Each bridge branch comprises in each case two switching elements. The in total six switching elements in the three bridge branches are numbered by TS1 through to TS6. The three motor phases a, b, c are in each case connected between the two switching elements of a bridge branch.

The switching elements TS1 to TS6 are each in the form of, for example, a MOSFET (Metal Oxide Semiconductor Field-Effect Transistor) or an IGBT (Insulated gate Bipolar Transistor). By virtue of corresponding clocking or switching of the individual switching elements TS1 to TS6 of the frequency converter, the respective motor phases can be connected alternately to the high and the low potential of the DC voltage intermediate circuit. By virtue of pulse width modulation, i.e. by virtue of clocked switching of the switching elements with a variable switching time, it is possible for the phase voltages or phase currents required for producing the magnetic rotating field in the stator to be impressed on the motor phases.

The in total six different active switching states of the frequency converter can be seen from FIGS. 2a), 2b) and 2c). The six active switching states occur if either an upper switching element (TS1, TS3, TS5) and two lower switching elements (TS2, TS4, TS6) or two lower and one upper switching element are switched to the on state simultaneously. The inactive states occur if either all of the upper or all of the lower switching elements are switched on.

In the space vector diagram shown in FIGS. 2a) and 2b), six voltage space vectors, which are arranged so as to be rotated in each case through 60° about a common central point, correspond to the six active switching states of the frequency converter. These voltage space vectors or switching states span the space in this coordinate system as a possible base.

In each case two switching states which are rotated through 180° correspond to the maximum voltages occurring in a respective motor phase, in each case with different mathematical signs. Correspondingly, these bases covering the space are summarized in FIG. 2 and denoted by a, b and c, corresponding to the associated motor phases. If, for example, a voltage space vector is located on the positive a axis, this corresponds to a switching state in which the upper switching element TS1 and lower switching elements TS4 and TS6 are each switched on. A voltage space vector which is located on the negative a axis corresponds to a switching state of the frequency converter in which the switching element TS2 and the switching elements TS3 and TS5 are each switched on. The same applies to the other bases or axes b and c correspondingly.

In terms of the invention, FIGS. 2a), 2b) and 2c) illustrate how in particular interference voltages or in particular an interference voltage space vector are produced for sampling possible fault sources in the motor phases and/or the switching elements of the frequency converter. As shown in FIG. 2a), in total six interference voltage space vectors $U_1$ to $U_6$ are produced corresponding to the original switching states of the frequency converter. Thus, the space illustrated is sampled in each case in 60° increments. Corresponding to FIG. 2b), six interference voltage space vectors are produced successively by corresponding clocking of in each case two switching states of the frequency converter. For example, the interference voltage space vector $U_1$ is produced by a combination of the first switching state, which corresponds to the maximum voltage in the motor phase a, with the switching state which corresponds to a negative maximum voltage in the motor phase c. The interference voltage space vectors produced as shown in FIG. 2b) also sample the entire space with equidistant angular increments of in each case 60°. As shown in FIG. 2c), a continuous interference voltage space vector U at any desired frequency f is produced at least over a full revolution.

Figure 3:
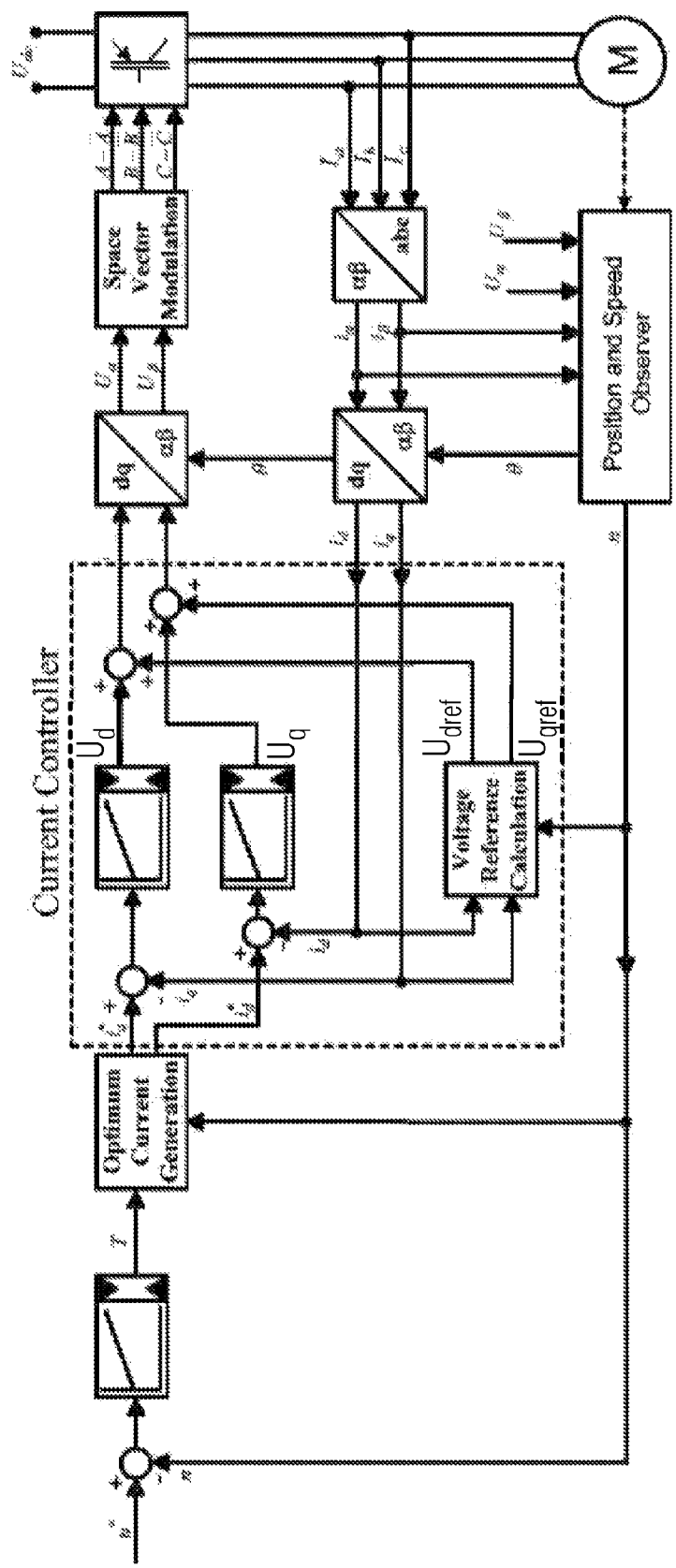
FIG. 3 shows a block circuit diagram for the closed-loop control of a polyphase motor by means of space vector variables.

FIG. 3 illustrates a block diagram of closed-loop control for a polyphase motor M by means of space vector variables. The right-hand side of this illustration shows the three motor phases, to which voltages are applied by a frequency converter. The DC voltage of the DC voltage intermediate circuit of the frequency converter is in turn denoted by $U_{dc}$. The phase currents $I_a$, $I_b$ and $I_c$ are tapped off at the motor phases of the polyphase motor M and supplied to the closed-loop control system. What is involved here is current-controlled driving. The current controller is labelled.

The starting point of the field-oriented closed-loop control illustrated are the setpoint currents $i^*_q$ and $i^*_d$ predetermined in the d, q reference system. These are the components of the actual current space vector in the d, q reference system in question. The setpoint current space vector with the components $i^*_q$ and $i^*_d$ is converted by means of the current controller into a corresponding phase voltage space vector with the components $U_d$ and $U_q$ which, whilst taking into consideration the angle of rotation θ, is converted into the α, β reference system and is used for driving the frequency converter in accordance with a corresponding mathematical conversion in a modulation device (space vector modulation).

For closed-loop control purposes, the tapped-off phase currents $I_a$, $I_b$ and $I_c$ from the reference system of the motor phases are converted into the α, β reference system and then converted, taking into consideration the angle of rotation θ in a position and rotation detection device (position and speed observer) into an actual current space vector in the d, q reference system with the components $I_d$ and $I_q$. The actual current space vector is fed forward for closed-loop control purposes to the setpoint current space vector. The voltage space vector which is output depending on the setpoint current space vector can be corrected by means of a predetermined mathematical model, depending on the motor type, the speed and further effects, via a correction device (voltage reference calculation).

The method for fault identification of a polyphase motor which is subjected to such closed-loop control is implemented without any further components and in particular without any further additional measurement complexity. In this case, in a rest state of the polyphase motor, an interference voltage space vector $U_{dref}$, $U_{qref}$ is fed forward to the controller output, i.e. the phase voltage space vector $U_d$, $U_q$ by means of the existing correction device (voltage reference calculation). By way of example in this regard, a setpoint current space vector $i^*_q$, $i^*_d$ with a value of in each case zero is predetermined. In other words, in the rest state of the polyphase motor, an adjustment by closed-loop control is made to a setpoint current of zero.

As a result of the predetermined interference voltage space vector $U_{dref}$, $U_{qref}$, currents will be set in the motor phases a, b and c which are compensated for by the controller by a corresponding phase space vector $U_d$, $U_q$ being output. In the intact state, a predetermined interference voltage $U_{dref}$ is compensated for by a phase voltage $U_d$ with the opposite mathematical sign, with the result that, in the corresponding motor phases, no voltage will occur. If the frequency converter has a defective switching element, or if there is an interruption or a short circuit in one of the motor phases a, b, c, the response of the closed-loop control will have a correspondingly different appearance. The currents measured in the motor phases will differ from one another with respect to the intact state.

FIGS. 4 to 11 now each show the measurement results of a method for fault identification, wherein in each case six interference voltage space vectors corresponding to FIG. 2b), denoted therein by $U_1$ to $U_6$, are fed forward to the controller output $U_d$, $U_q$ in FIG. 3 successively for a three-phase polyphase motor with a control system as shown in FIG. 3. The interference voltage space vectors are in this case produced in the existing closed-loop control system by means of the correction device (voltage reference calculation). FIGS. 4, 6, 8 and 10 each show the profile of the corresponding voltages and interference voltages in the d, q reference system. FIGS. 5, 7, 9 and 11 show the profile of the same voltages and interference voltages in the reference system of the motor phases a, b and c.

In FIGS. 4, 6, 8 and 10, in each case the respective angle of rotation of the rotor or the illustrated space vector is illustrated by θ. This can be seen as a step function. The associated angles of rotation can be read off from the right-hand y axis.

Corresponding to FIG. 2b), for fault identification the interference voltage space vectors with the components $U_{dref}$ and $U_{qref}$ are produced with angles of −150° ($U_4$) to +150° ($U_3$), and in each case the corresponding effect thereof on the controller output is observed. For this purpose, the phase voltage space vector output by the controller with the components $U_d$ and $U_q$ is used corresponding to FIG. 3.

In FIGS. 5, 7, 9 and 11, the corresponding interference voltages and phase voltages are converted into the reference system of the motor phases a, b and c. In each case the interference voltages $U_{aref}$, $U_{bref}$ and $U_{cref}$ and the phase voltages $U_a$, $U_b$ and $U_c$, which are assigned to the motor phases a, b, c are illustrated.

The voltage profiles shown in FIGS. 6 to 11 correspond to an interference voltage space vector which is predetermined in each case with a different angle of rotation and with the components $U_{dref}$=33.4V and $U_{qref}$=0. The setpoint current space vector is predetermined by the two components $i^*_d$ and $i^*_q$ of in each case 0.

Figure 4:
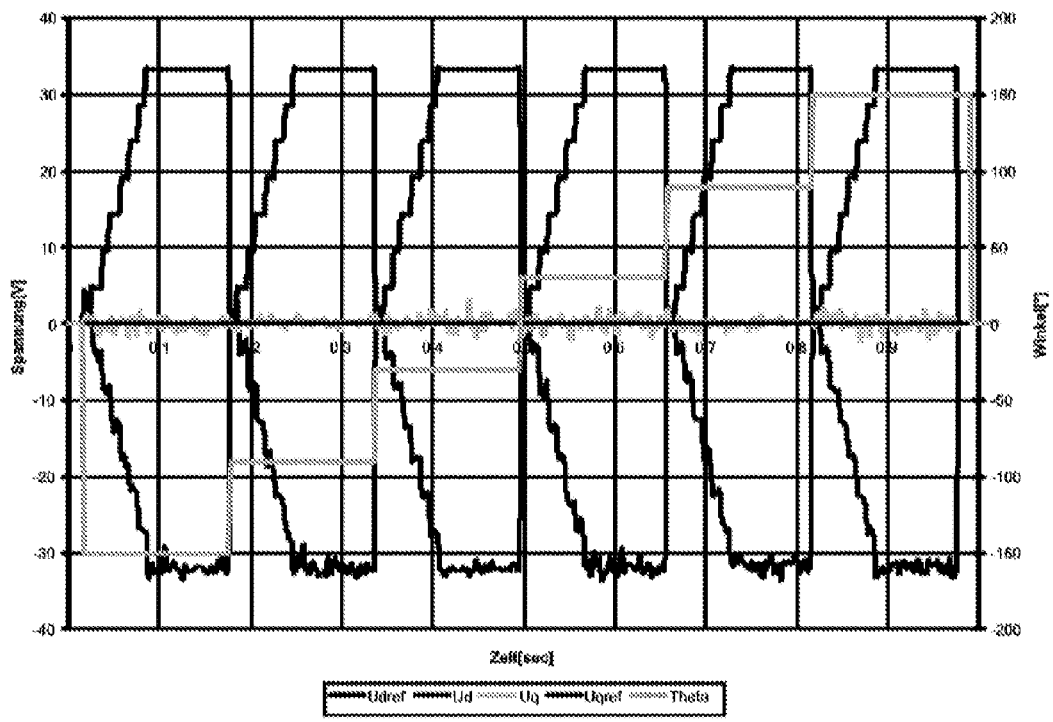
FIGS. 4 and 5 show, in the d, q reference system and in the reference system of the motor phases, the profile of the phase voltages and interference voltages in the case of an intact drive system.
Figure 5:
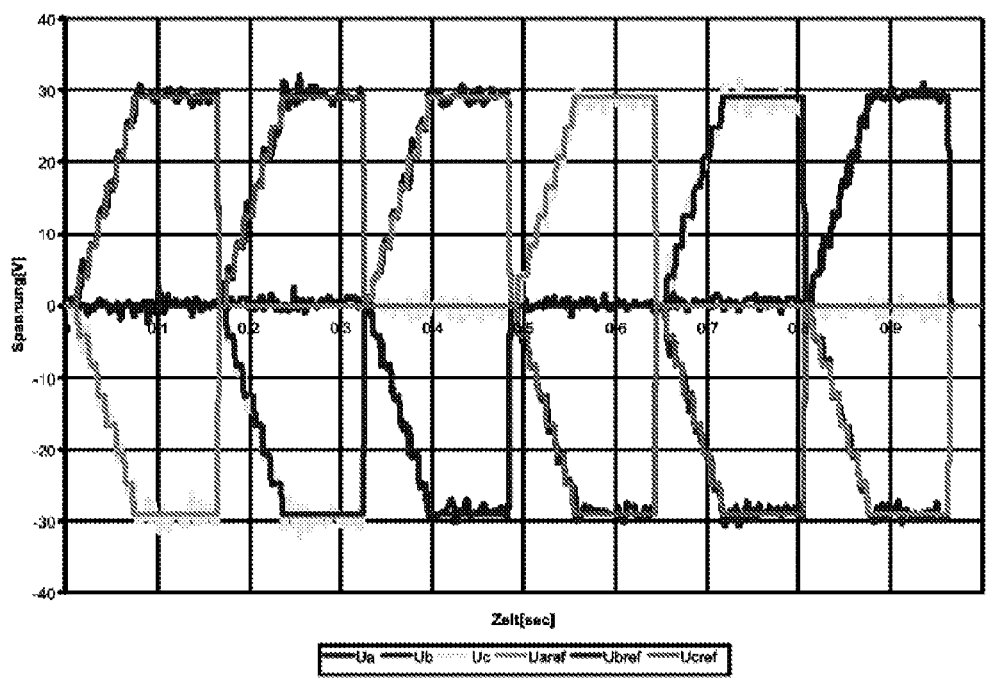

The profile of the voltages illustrated in FIGS. 4 and 5 corresponds to an intact drive system. For all six interference voltage space vectors which are run through and the switching states of the frequency converter associated therewith, a correspondingly output interference voltage $U_{dref}$ is compensated for by a back-emf $U_d$. The same symmetrical image with respect to the 0 line results in all six interference voltage situations. Since the interference voltage $U_{gref}$ has been selected to be equal to 0, no back-emf $U_q$ is output either.

The same applies to FIG. 5, in which the phase voltages or the interference phase voltages in the reference system of the motor phases a, b, c are illustrated. Voltage is applied alternately to the different motor phases. In this case, in each case a correspondingly suitable back-emf is produced at the controller output.

Figure 6:
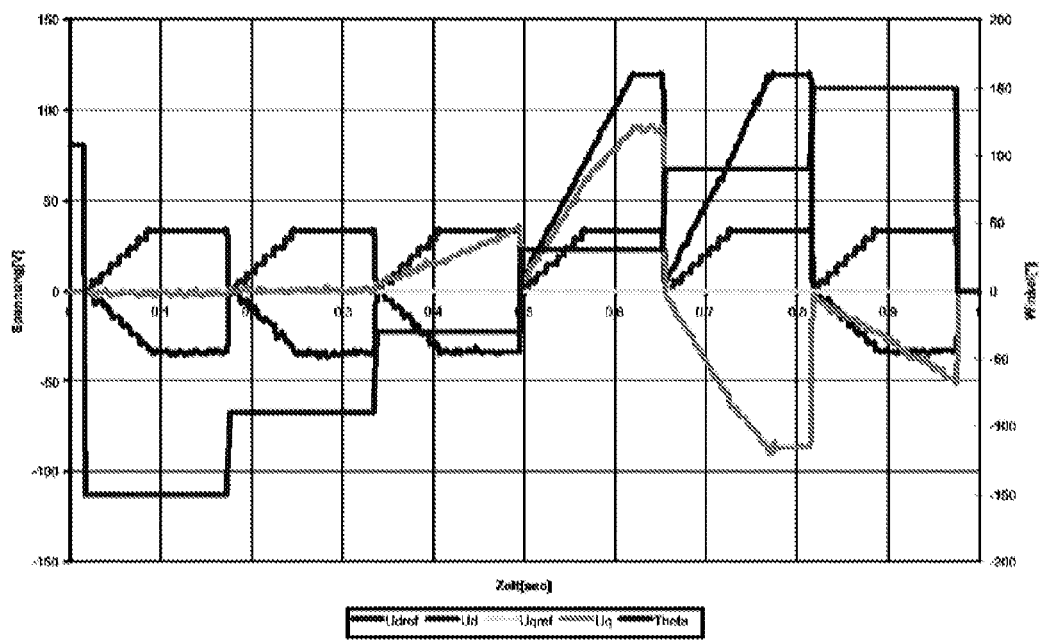
FIGS. 6 and 7 show, in the d, q reference system and in the reference system of the motor phases, the profile of the phase voltages and interference voltages in the event of a defective, sixth switching element of the frequency converter.
Figure 7:
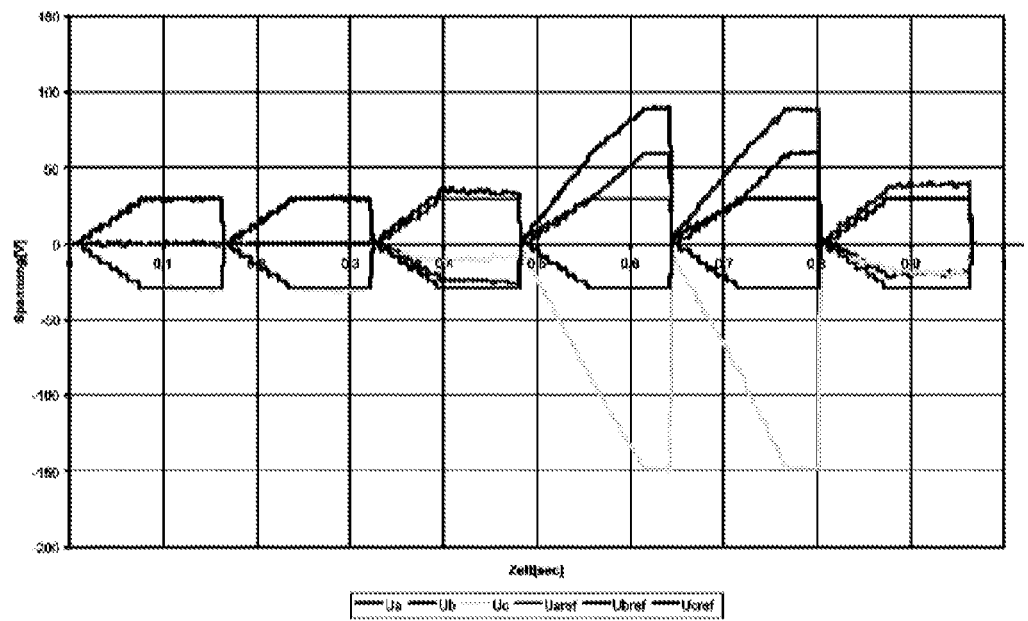

FIGS. 6 and 7 correspond to the situation in which, as shown in FIG. 1, the lower switching element TS6 is defective. As shown in FIG. 6, there is no noticeable change with respect to the intact profile initially in the interference voltage situations assigned to the angles of rotation of −150°, −90°, −30° and +150°. The interference voltages and the phase voltages are substantially symmetrical with respect to the zero line. However, this symmetry is broken noticeably in the interference voltage situations in which an interference voltage space vector with the angles of +30° and +90° is applied.

It can be seen from FIG. 2b) that the angles of +30° and of +90° correspond to the applied interference voltage space vectors $U_1$ and $U_2$. It becomes apparent that the interference voltage space vector $U_1$ is produced by a combination of a positive switching state "a" and a negative switching state "c", as a result of which it is already possible to draw the conclusion, corresponding to FIG. 1, that there is a fault in the bridge branches of the frequency converter which are assigned to the motor phases a and c. Corresponding to FIG. 2b), the interference voltage space vector $U_2$ is produced by a linear combination of a negative switching state "c" and a positive switching state "b". Corresponding to FIG. 1, this would make it possible to conclude that there is a fault in the bridge branches of the frequency converter which are assigned to phases b and c. As shown in FIG. 6, the fault occurs in each case in the negative switching states "c", as shown in FIG. 2b). As shown in FIG. 1, it is now possible to conclude that the switching element TS6 is defective.

The same information can also be derived from the voltage profiles in the reference system of the motor phases corresponding to FIG. 7.

Figure 8:
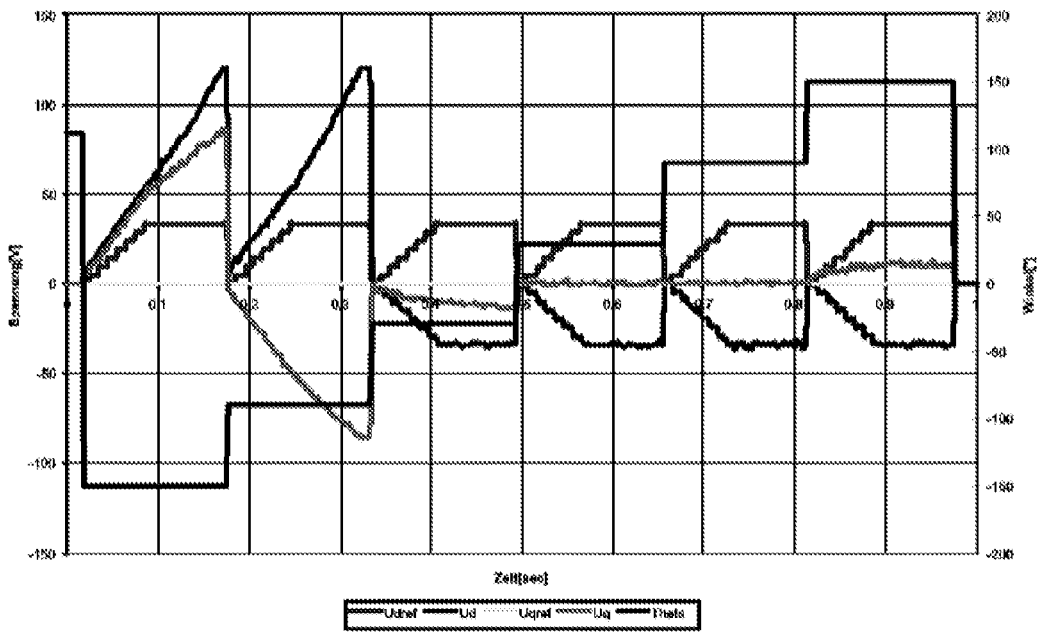
FIGS. 8 and 9 show, in the d, q reference system and in the reference system of the motor phases, the profile of the phase voltages and interference voltages in the event of a defective, fifth switching element of the frequency converter.
Figure 9:
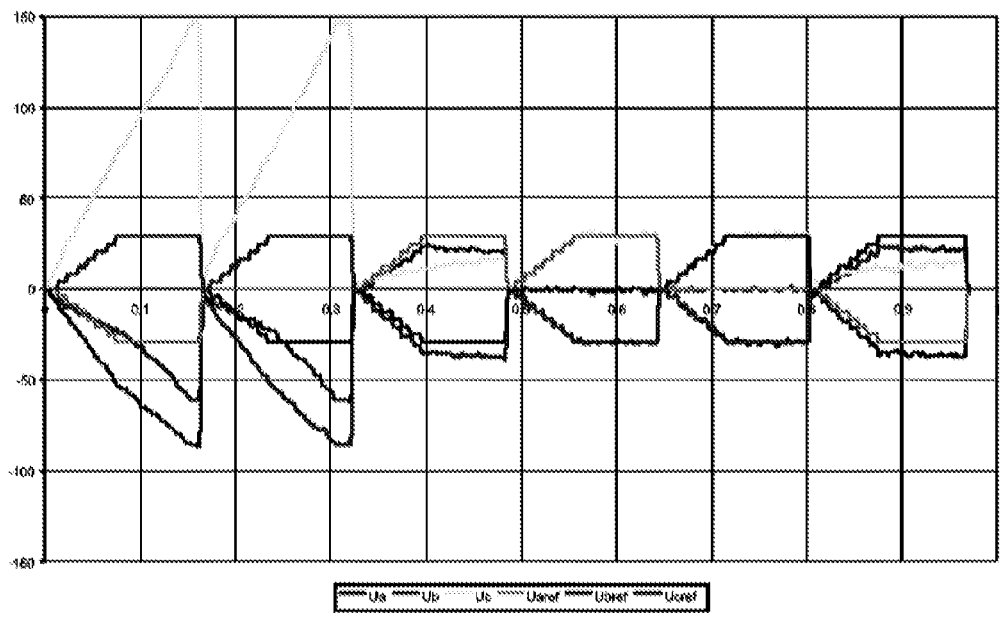

In FIGS. 8 and 9, the voltage profiles illustrated now correspond to the state in which, according to FIG. 1, the switching element TS5 of the frequency converter is defective.

Figure 2:
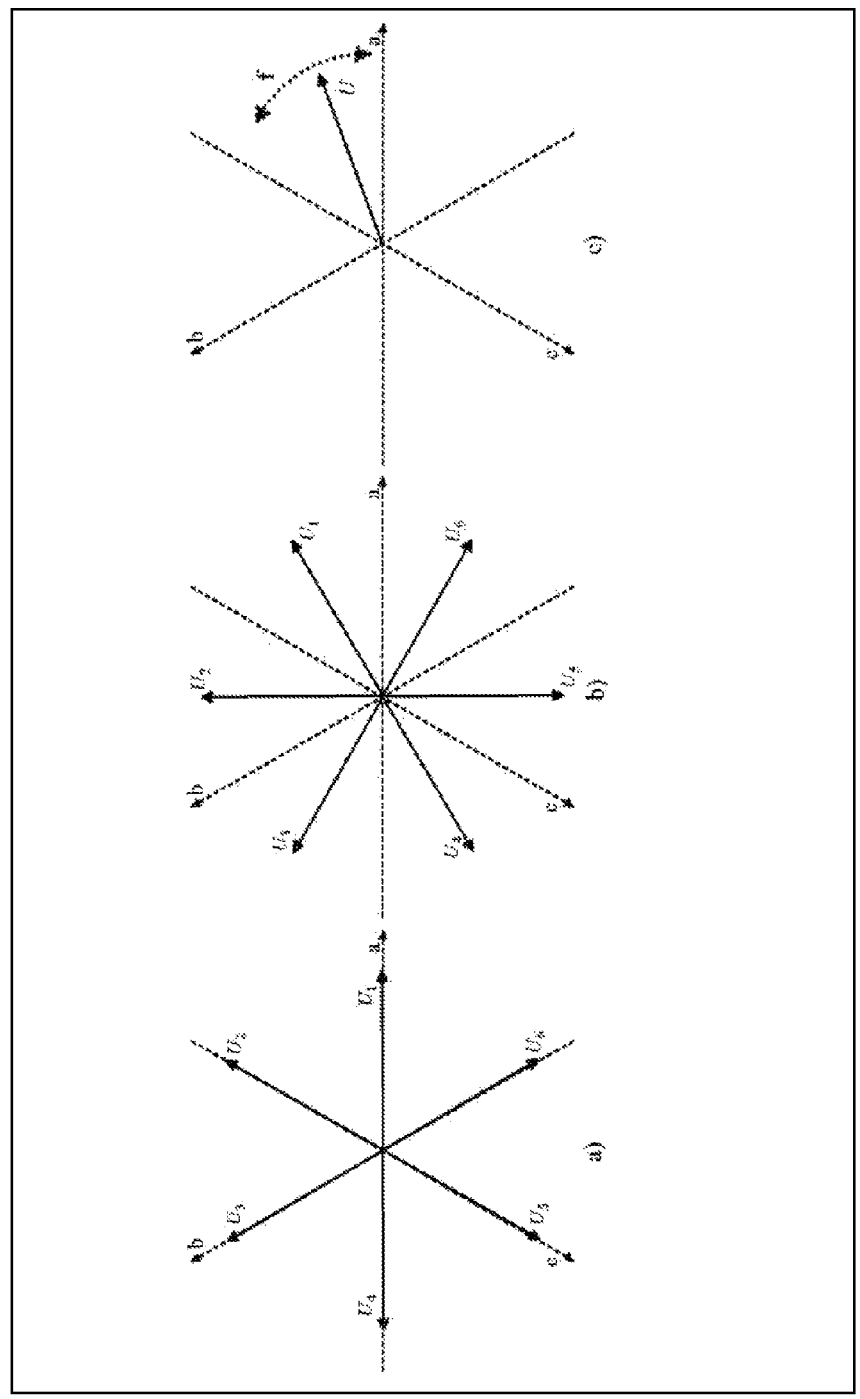
FIG. 2 shows three variants for producing interference voltage space vectors.

It becomes immediately apparent from FIG. 8 that the symmetrical profile of the voltages is interrupted where the interference voltage space vector is applied with an angle of −150° and −90°. As shown in FIG. 2, in this regard, the interference voltage space vectors $U_4$ and $U_5$ are applied. Corresponding to that which has been mentioned above, it can be concluded from this that a fault occurs when switching the motor phase c to the high potential corresponding to FIG. 1.

It is therefore possible to conclude from the profile corresponding to FIG. 8 and likewise from FIG. 9 that there is a faulty switching element TS5 corresponding to FIG. 1.

Figure 10:
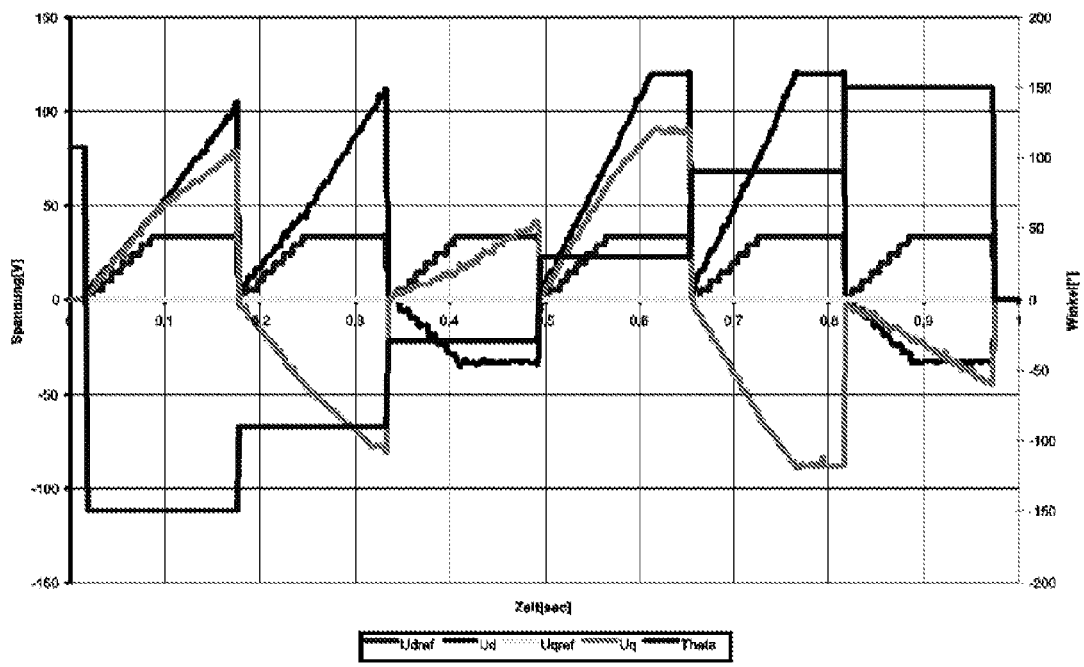
FIGS. 10 and 11 show, in the d, q reference system and in the reference system of the motor phases, the profile of the phase voltages and interference voltages in the event of an interruption of the third motor phase.
Figure 11:
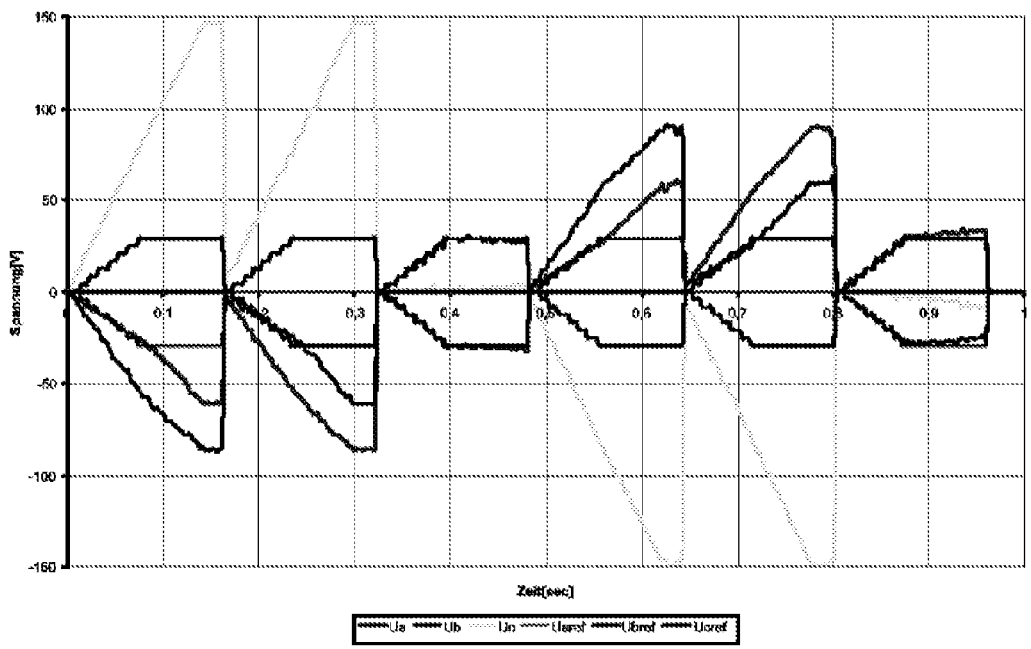

The profile of the voltages corresponding to FIGS. 10 and 11 now relates to the case in which the motor phase c has an interruption. It will become immediately apparent from both figures that the symmetry of the voltage profiles with respect to the zero line when the interference voltage space vector with the angles −150°, −90°, +30° and +90° is applied is interrupted. In turn, with reference to FIG. 2 it can be concluded that, correspondingly, the interference voltage space vectors $U_4$, $U_5$, $U_1$ and $U_2$ are affected. It will become immediately apparent that all of these interference voltage space vectors are formed by a combination with a switching state "c". In this case, the fault occurs irrespective of the mathematical sign of the switching state "c". To this extent, it is possible to directly conclude that the motor phase c has been interrupted.

The invention claimed is:

1. A method for fault identification when driving a polyphase motor by way of a frequency converter, the method which comprises:
   in a rest state of the polyphase motor, controlling the phase voltages of the polyphase motor with the frequency converter and measuring the phase currents of the polyphase motor;
   subsequently, and in the rest state of the polyphase motor, adjusting the phase currents or current variables derived therefrom by closed-loop control to a predetermined setpoint current variable;
   controlling the frequency converter so as to output an interference voltage variable for the phase voltages;
   observing a response of the closed-loop control to the interference voltage variable; and
   concluding from the response of the closed-loop control whether or not a fault exists in the frequency converter and/or in the phases of the polyphase motor.

2. The method according to claim 1, which comprises:
   controlling the polyphase motor with field-oriented closed-loop control by way of space vector variables, and thereby
   driving the frequency converter electronically by way of a voltage space vector and using a current space vector formed from the phase currents as controlled variable;
   predetermining the setpoint current variable as a setpoint current space vector;
   feeding forward an interference voltage space vector to the controller output as the interference voltage variable; and
   observing the voltage space vector output by the closed-loop control system as the response.

3. The method according to claim 1, which comprises adjusting the phase currents by closed-loop control to a value of less than a tenth of the rated currents of the polyphase motor by way of the setpoint current variable.

4. The method according to claim 3, which comprises adjusting the phase currents by closed-loop control to a zero current by way of the setpoint current variable.

5. The method according to claim 4, which comprises feeding forward the interference voltage space vector a plurality of times with different rotary angles, and observing the respective response of the closed-loop control.

6. The method according to claim 2, which comprises continuously feeding forward the interference voltage space vector with any arbitrary frequency at least over a full revolution, and observing the respective response of the closed-loop control.

7. The method according to claim 6, which comprises feeding forward the interference voltage space vector a plurality of times, shifted through in each case the same angular increment, over a full revolution.

8. The method according to claim 5, which comprises feeding forward the interference voltage space vector a plurality of times, shifted through in each case the same angular increment, over a full revolution.

9. The method according to claim 8, wherein the polyphase motor is a three-phase polyphase motor subjected to closed-loop control, and which comprises feeding forward the interference voltage space vector six times, shifted in each case with an angular increment of 60°, over a full revolution.

10. The method according to claim 2, which comprises observing as the response the variable of the components of the voltage space vector output by the controller or the variable of the converted phase voltages.

11. The method according to claim 3, which comprises observing as the response the variable of the components of the voltage space vector output by the controller or the variable of the converted phase voltages.

12. The method according to claim 4, which comprises observing as the response the variable of the components of the voltage space vector output by the controller or the variable of the converted phase voltages.

13. The method according to claim 5, which comprises observing as the response the variable of the components of the voltage space vector output by the controller or the variable of the converted phase voltages.

14. The method according to claim 6, which comprises observing as the response the variable of the components of the voltage space vector output by the controller or the variable of the converted phase voltages.

15. The method according to claim 7, which comprises observing as the response the variable of the components of the voltage space vector output by the controller or the variable of the converted phase voltages.

16. The method according to claim 8, which comprises observing as the response the variable of the components of the voltage space vector output by the controller or the variable of the converted phase voltages.

17. The method according to claim 10, which comprises observing as the response a ratio of the components of the output voltage space vector and of the interference voltage space vector or of the converted corresponding phase voltages.

18. The method according to claim 10, which comprises:
- if a corresponding unexpected discrepancy between the interference voltage variable and the output voltage of the current controller is detected, concluding that there has been an interruption of the frequency converter; or
- if an excess current is detected, concluding that there is a ground fault or a short-circuited switching element of the frequency converter.

19. The method according to claim 18, which comprises feeding forward the interference voltage space vector a plurality of times with a different rotary angle, and concluding, from the assignment of the detected unexpected discrepancy to the rotary angle, that there has been an interruption, or, from the assignment of the detected excess current, concluding that there is the specific short-circuited switching element or the specific motor phase with a ground fault.

20. The method as claimed in claim 1, which comprises, in the event of fault-free running, observing the phase currents during run-up of the polyphase motor, and, in the event of an excess current being established, concluding that there exists a terminal short circuit between the motor phases.

* * * * *